United States Patent
Bhandari et al.

(10) Patent No.: US 7,627,293 B2
(45) Date of Patent: Dec. 1, 2009

(54) STRATEGIC PREDISTORTION FUNCTION SELECTION

(75) Inventors: Rajan Bhandari, Newbury (GB);
Stephen Summerfield, Weybridge (GB);
Alan Barry Christie, Swindon (GB)

(73) Assignee: Alcatel-Lucent USA Inc., Murray Hill, NJ (US)

(*) Notice: Subject to any disclaimer, the term of this patent is extended or adjusted under 35 U.S.C. 154(b) by 392 days.

(21) Appl. No.: 11/617,113

(22) Filed: Dec. 28, 2006

(65) Prior Publication Data

US 2008/0157869 A1    Jul. 3, 2008

(51) Int. Cl.
*H04B 1/04* (2006.01)
*H04L 25/03* (2006.01)
*H03F 1/26* (2006.01)

(52) U.S. Cl. .......... 455/114.3; 455/126; 455/115.1; 375/296; 375/297; 330/149

(58) Field of Classification Search .......... 455/114.2, 455/114.3, 115.1, 126; 375/296, 297; 330/149
See application file for complete search history.

(56) References Cited

U.S. PATENT DOCUMENTS

| | | | | |
|---|---|---|---|---|
| 5,023,937 A * | 6/1991 | Opas | .......... | 455/126 |
| 5,655,220 A * | 8/1997 | Weiland et al. | .......... | 455/69 |
| 5,732,333 A * | 3/1998 | Cox et al. | .......... | 455/126 |
| 6,141,390 A * | 10/2000 | Cova | .......... | 375/297 |
| 6,246,286 B1 * | 6/2001 | Persson | .......... | 330/149 |
| 6,484,017 B1 * | 11/2002 | Kim | .......... | 455/126 |
| 6,614,854 B1 * | 9/2003 | Chow et al. | .......... | 375/297 |
| 6,741,662 B1 * | 5/2004 | Francos et al. | .......... | 375/297 |
| 6,745,015 B2 * | 6/2004 | Yochem | .......... | 455/126 |
| 6,751,447 B1 * | 6/2004 | Jin et al. | .......... | 455/114.3 |
| 6,864,745 B2 * | 3/2005 | Ode et al. | .......... | 330/149 |
| 7,149,484 B2 * | 12/2006 | Nation | .......... | 455/126 |
| 7,248,112 B2 * | 7/2007 | Itahara | .......... | 330/149 |
| 7,340,223 B1 * | 3/2008 | Wright et al. | .......... | 455/91 |
| 7,443,923 B2 * | 10/2008 | Shako et al. | .......... | 375/296 |
| 2002/0101938 A1 * | 8/2002 | Horaguchi et al. | .......... | 375/297 |
| 2002/0191710 A1 * | 12/2002 | Jeckeln et al. | .......... | 375/296 |
| 2003/0184372 A1 * | 10/2003 | Fudaba et al. | .......... | 330/149 |
| 2004/0132424 A1 * | 7/2004 | Aytur et al. | .......... | 455/335 |
| 2006/0182197 A1 * | 8/2006 | Godambe et al. | .......... | 375/297 |
| 2006/0229036 A1 * | 10/2006 | Muller et al. | .......... | 455/114.3 |

* cited by examiner

*Primary Examiner*—Duc M Nguyen
(74) *Attorney, Agent, or Firm*—Carlson, Gaskey & Olds, P.C.

(57) ABSTRACT

A corrective predistortion function is applied to a signal to compensate for or cancel out distortion that is introduced by a component that processes the signal. A disclosed example includes applying a corrective predistortion function to a transmitted signal used for wireless communications. A technique for selecting the corrective predistortion function includes determining a current power level of the signal. When the current power level is at or below a lift level between a maximum signal power level and a minimum signal power level, a corrective predistortion function corresponding to the lift level is applied to the signal. When the actual signal power level is above the lift level, a corrective predistortion function corresponding to the actual current power level is applied.

18 Claims, 1 Drawing Sheet

STRATEGIC PREDISTORTION FUNCTION SELECTION

TECHNICAL FIELD

This invention generally relates to communication. More particularly, this invention relates to predistortion use for communication signal processing.

DESCRIPTION OF THE RELATED ART

Nonlinear components such as amplifiers along a wireless communication transmitter path tend to introduce various forms of distortion. One technique for compensating for or cancelling out any such distortion includes adding a distortion component to the transmitted signal. Such an added component is typically introduced in a transmit path prior to the component responsible for the distortion. Accordingly, such techniques are commonly referred to as predistortion.

The compensating predistortion component may be added in a digital domain or an analog domain. Analog predistortion performance is limited because it is not variable once set for a component and therefore has an associated cost that is tied to the cost of radio frequency components. It is generally considered advantageous to include a predistortion function in a digital domain so that it can be shared over several components such as amplifiers. Additionally, predistortion functions in the digital domain have an associated cost tied to the less expensive cost of digital processing.

Various methods for calculating a predistortion function are known. One commonly used approach includes a sampled data digital predistortion system. This approach includes a feedback path from a distorting component output so that the output from the distorting component and the desired transmitted signal can be compared. An appropriate predistortion function is based upon the comparison and applied digitally to the transmitted signal. There are well known techniques for determining such predistortion functions.

In some approaches the predistortion function is calculated during transmission of a specially designed training signal. One advantage to using such a training signal is that it can be stepped to specific power levels and can introduce a specific amount of noise. The sampled signals therefore tend to provide reliable information for determining a predistortion function. A disadvantage associated with such a test signal is that it is not desirable to introduce such power and noise levels into a system that is being used for live wireless communications. It is necessary to periodically update a predistortion function to compensate for component aging and temperature or other drift effects so something typically is done on an ongoing basis.

One approach includes sampling existing conditions such as transmitted signals used during actual communications. Such signals can vary in different manners (e.g., power level) such that the data samples may not be useful or desirable for deriving coefficients to be used in a predistortion function. In some instances, it is not possible to sample enough data to reliably update a predistortion function.

The coefficients required to achieve good linearity will depend on factors that change with time. These may include environmental, with temperature being most significant, or signal conditions. For mobile communications, the instantaneous signal changes at a rate dependent on the channel bandwidth. Additionally, there are power envelopes within a range of time scales from tens of microseconds up to many seconds. Additionally, spectral content and signal statistics may vary. In general, for acceptable performance, the predistortion function has to track such changes. Therefore, the coefficients that are applied need to change with time. Therefore, the periodic updates are required.

The rate at which the coefficients need to be updated is related to fundamental time constants for the predistortion function. These will in general depend on the amplifier or other component that introduces the distortion and the nature of the signal. In principal, the time constant reflects the scale over which the average signal condition should guide the evolution of the predistortion coefficients. In general, time constants lie in the range from 50 milliseconds to 5 seconds. These time constants depend on amplifier technology and a latency of environmental conditions.

Updating the coefficients at a required rate through repeated signal sampling (e.g., capture) and estimation may require considerable processing resources in many examples. Some approaches include using stored tables for various signal conditions that may be encountered.

One problem with applying a corrective predistortion function based on an average power with some time constant is that the power report will always have a lag relative to a power step in the digital signal of interest. The digital average power of a signal that undergoes a step change lags the actual power. Any function that induces a delay suffers in a similar way. The actual lag or delay is based upon an averaging filter's time constant.

During a time when the average power value is lagging behind the true power, a corrective predistortion function selected for the average power corresponds to a lower power than the actual power of the signal of interest. Using a corrective predistortion function for a power that is lower than an actual power leads to a transient increase in spectral emissions, which in most cases are worse than the emission obtained by applying a desired corrective predistortion function. Spectral emissions in some instances can exceed a permitted transmission mask. Therefore, it is desirable to avoid applying a corrective predistortion function for a power that is lower than the actual power when the function is applied.

SUMMARY

An exemplary method of controlling distortion in the signal includes selecting a lift power level between a maximum power level of the signal and a minimum power level of the signal. Determining a current power level of the signal allows for applying a corrective predistortion function to the signal based upon the determined current power. The corrective predistortion function corresponds to the selected lift power level when the determined current power level is at or below the lift power level.

In one example, the corrective predistortion function corresponds to the determined current power level when the determined current power level exceeds the lift power level.

An example device for processing the signal includes a component that tends to introduce distortion as a result of processing the signal. A predistortion function selector is configured to select a corrective predistortion function to be applied to the signal based on a current signal power level. The predistortion function selector selects a corrected predistortion function corresponding to a lift power level between a maximum signal power level and a minimum signal power level when the current signal power level is at or below the lift power level.

The use of the lift level increases the dynamic range of a currently used predistortion function or current operating power table.

The various features and advantages of this invention will become apparent to those skilled in the art from the following detailed description. The drawings that accompany the detailed description can be briefly described as follows.

DETAILED DESCRIPTION

Figure 1:
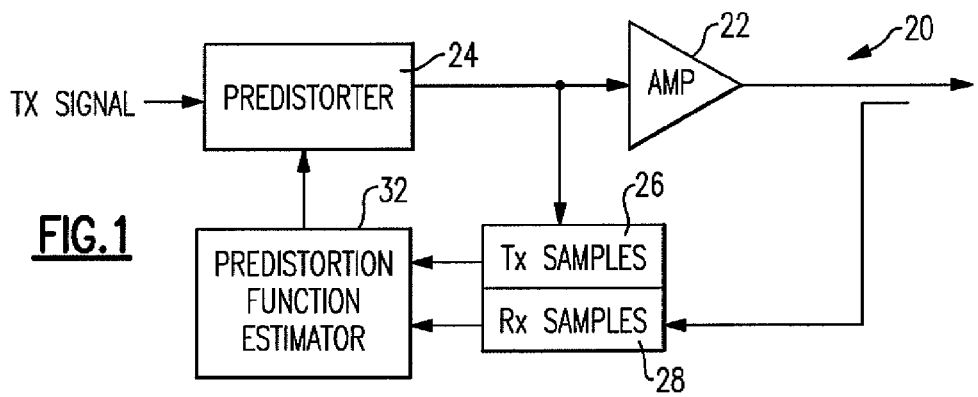
FIG. 1 schematically illustrates an example device designed according to an embodiment of this invention.

FIG. 1 schematically illustrates a signal processing device 20. In one example, the signal processing device 20 is used for wireless communications. In the illustrated example, the device 20 is used for transmitting wireless communication signals. An amplifier 22 is a component within the device 20 that tends to introduce distortion into a transmitted signal. Such a component is referred to as a distorting component in this description. A predistorter module 24 introduces predistortion into a transmitted signal before the signal reaches the amplifier 22. The predistortion is intended to compensate for or cancel out the distortion that will be introduced by the amplifier 22 such that the resulting transmitting signal corresponds to a desired signal.

The example of FIG. 1 includes sampling buffers 26 and 28 that are used for obtaining samples of signals to indicate an amount of distortion present in the transmitted signal. In the illustrated example, the buffer 26 obtains samples of the transmit signal prior to encountering the amplifier 22. The buffer 28 obtains samples of the signal after it has been processed by the amplifier 22 (e.g., a feedback sample). In some examples, the buffer 26 is referred to as a transmit sample buffer while the buffer 28 is referred to as a receive sample buffer.

Information from the sample buffers 26 and 28 is used for determining a predistortion function. The illustrated example includes a predistortion function estimator module 32 that utilizes information from a capture set (e.g., a set of signal samples) for determining a predistortion function in a known manner. The predistorter module 24 uses the information from the predistortion function estimator 32 for applying predistortion to a transmitted signal.

The predistortion function estimator 32 utilizes a measurement of signal power that is obtained in a known manner. The determined signal power provides a basis for selecting appropriate coefficients for a predistortion function. As known, corrective predistortion functions generally correspond to a measured or determined signal power level. The example predistortion function estimator module 32 determines the predistortion function corresponding to the current power level of the signal and strategically selects the predistortion function based on the current power level of the signal in a unique manner.

Figure 2:
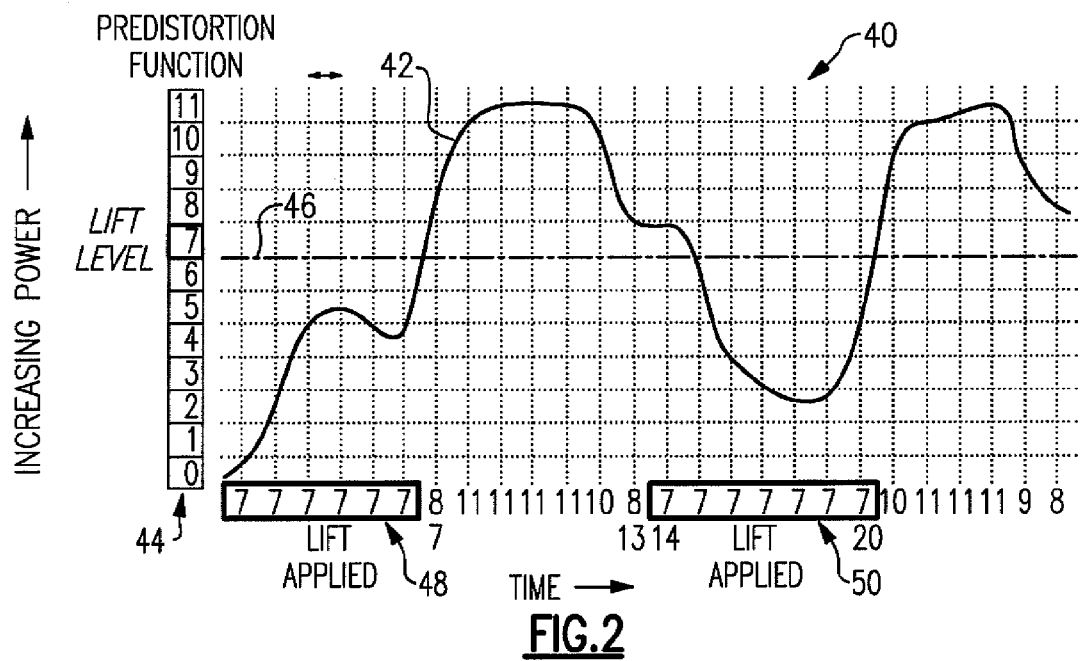
FIG. 2 is a graphical illustration schematically demonstrating a feature of an example embodiment of this invention.

FIG. 2 includes a plot 40 of a power profile 42. As can be appreciated from the illustration, the power level illustrated by the power profile 42 varies over time. In this example, a plurality of predistortion functions schematically shown at 44 are stored in a table with each function corresponding to a power level of the signal. The full range of the distorting component such as the amplifier 22 is divided into a plurality of steps (e.g., typically 32), each having a corresponding corrective predistortion function. One example includes a memory table including a corrective predistortion function or set of coefficients for each such level.

The illustrated example includes a lift level at 46. Whenever the current power level of the signal is below the lift level 46, the corrective predistortion function corresponding to the lift level is applied instead of applying a predistortion function corresponding to the lower, actual current power level. In other words, whenever the current power level is at or below the lift level 46, the corrective predistortion function that is applied corresponds to the lift level 46.

When the lift level is a power level that is significantly above a minimum power (e.g., that associated with overhead channels in wireless communications), the transient increase in spectral emissions typically associated with a power step can be advantageously reduced by applying the predistortion function associated with the lift level when the current power level is at or below the lift level. The lift level provides an improved dynamic range to cope with transients to power levels above the lift level and transients below the lift level.

In the example of FIG. 2, the first six sampling intervals include a power level that is below the lift level 46. As schematically shown at 48, the lift level corrective predistortion function is applied even though the power level of the power profile 42 is below the lift level in each of those sampling intervals. The next seven sampling intervals include a current power level that is above the lift level so that the predistortion function corresponding to the actual current power level is applied. During the $14^{th}$ through the $20^{th}$ sampling intervals of the illustrated example, the power level is again at or below the lift level 46. As schematically shown at 50, the corrective predistortion function corresponding to the lift level 46 is applied during each of those intervals.

The example approach takes advantage of the known fact that a predistortion function at a given power will provide good predistortion margins for operation at most powers below that power. The lift level 46 is selected in this example to correspond to a corrective predistortion function at a power level that provides a good margin for all powers below the lift level. One example includes empirically determining a maximum operating signal level and then setting the lift level to be between about 2 dB and about 6 dB below the maximum operating power. Given this description, those skilled in the art will be able to select an appropriate power level and corrective predistortion function to be used as the lift level for their particular situation. One example includes taking into consideration how fast predistortion is applied when selecting the lift level.

In the illustrated example, when the current power level of the signal of interest is below the lift level power 46, the corrective predistortion function corresponding to the lift level is used for predistortion rather than the function corresponding to the lower, actual current power. That way, if there is a step-up in power and a new corrective predistortion function must be applied, the predistortion function that is applied during the lag in average power associated with the step up will not be the function associated with the lower actual power but, instead, will be that associated with the lift level 46. By using the higher power level corrective predistortion function associated with the lift level compared to the one associated with a lower, current power level, the emission transients that are otherwise observed during the inevitable lag are reduced. The lag will be implementation-specific. In any event, the lift level expands options for table-switching techniques.

For example, the power level at 52 in FIG. 2 is below the lift level 46 while the power level at 54 is above the lift level 46. If the corrective predistortion function associated with the actual, current power level at 52 were applied during the step-up in power from 52 to 54, there would be a larger emission transient compared to using the corrective predistortion function associated with the lift level at the point 52. In other words, using the corrective predistortion function corresponding to the lift level 46 during such a power step-up closes the gap between the actual power level before and after a step-up in power, which effectively reduces or eliminates the lag effect associated with determining an average power during a step-up in a digital signal.

As mentioned above, some predistortion function estimator modules 32 include a table of corrective predistortion functions, each corresponding to signal power levels. Each of those functions or at least their coefficients should be updated periodically to account for component aging and temperature effects, for example. In some examples it becomes possible for the actual corrective predistortion function coefficients to become inaccurate if the actual signal power level remains below the lift level for an extended period of time. The function at the lift level will not be able to be adapted for quite some time, for example, if the power level continuously remains below the lift level over a time during which an ambient temperature or another condition may have changed. The example of FIG. 3 addresses such a situation by adjusting the lift level as a function of time to avoid an undesired loss of the validity and accuracy of the lift level.

Figure 3:
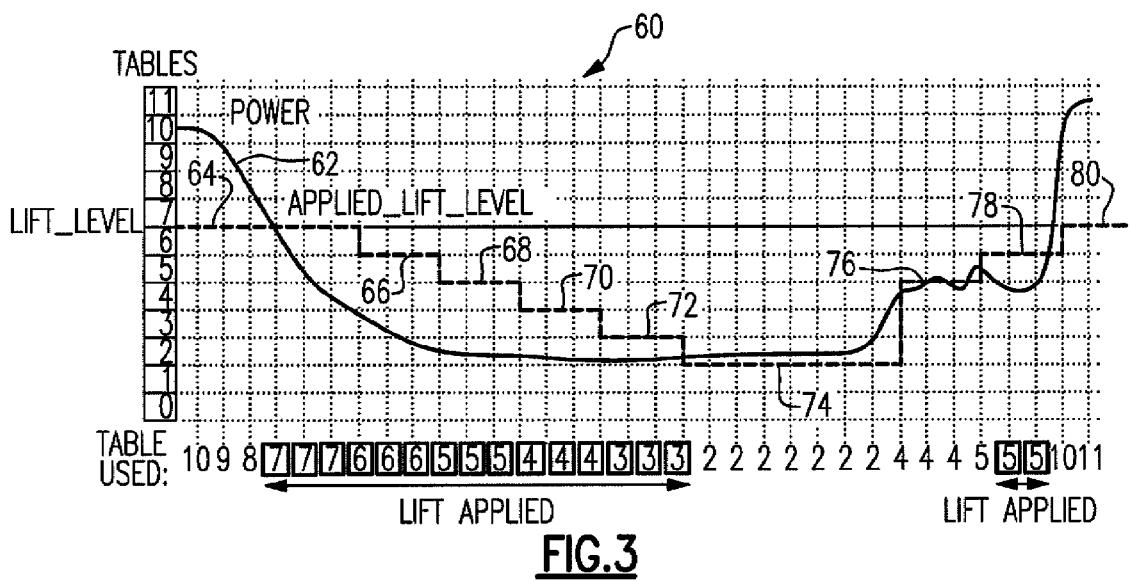
FIG. 3 is a graphical illustration schematically demonstrating a feature of an example embodiment of this invention.

In FIG. 3, a plot 60 includes a power profile 62 like the power profile 42 of FIG. 2. As can be appreciated from the illustration, the power level 62 remains relatively low for a relatively extended period of time. In particular, the power level 62 remains below a target lift level 64 for a significant portion of the time shown in FIG. 3. Once the current actual power level remains below the lift level 64 for a sufficient amount of time, the lift level is reduced in steps until a corrective predistortion function is located that has been updated sufficiently recently to be useful for a given a current signal power level. If a corrective predistortion function has not been updated for a predetermined amount of time, that function may be considered "stale." In one example, a corrective predistortion function is considered stale if eight hours have elapsed without the coefficients being recalculated. In such an example, the rate of decreasing the lift level is designed so that it falls from the target lift level 64 to the lowest level having a corresponding corrective predistortion function in no more than eight hours.

In FIG. 3, the lift level 64 is decreased by one increment (e.g., one power level associated with a table including the corrective predistortion functions) to the level shown at 66. After some time, because the current power level is below the new lift level 66, the lift level is again decreased to the level shown at 68. In the illustrated example, the lift level is decremented to the level shown at 70 and then 72 followed by the level shown at 74. Because the actual power level is below that associated with the lift levels shown at 64-72, the corrective distortive functions at those levels are not considered accurate enough to maintain any of those levels as the adjusted lift level. The level at 74, however, corresponds closely enough to the actual power level that it is considered reliable for the new lift level based, in part, on the recent signal power level behavior. In other words, the target lift level at 64 is decremented in a predetermined manner until the recent power variations permit the calculation of a function at the highest available level below the target lift level 64. Once the corrective power function associated with a current target level has been calculated, that target level becomes the adjusted lift level. In the example of FIG. 3, this occurs at the power level shown at 74.

It is desirable to return the lift level to the target level 64 when possible. In the illustrated example, the lift level is increased from the level shown at 74 to the level shown at 76 responsive to the power level increasing during the corresponding sampling intervals. Whenever a new table function is applied that is between the current lift level and the target lift level (e.g., between the level 74 and 64 in FIG. 3), the lift level is immediately set to the new table level. In other words, because the actual power level increases to the level associated with the lift level at 76, the new lift level is set to the level at 76. The example of FIG. 3 includes another step increase to a lift level at 78 that is used for several sampling intervals until it is eventually increased at 80, which corresponds to the target lift level 64.

The example of FIG. 3 allows for adjusting the lift level from an initial target value to maintain better accuracy and more recently updated coefficients associated with the corrective predistortion functions at various power levels below the target lift level.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A method of controlling distortion in a signal having a range of power levels between a maximum power level and a minimum power level, comprising the steps of:

selecting a lift power level between the maximum power level and the minimum power level;

determining a current power level of the signal; and applying a corrective predistortion function to the signal, the corrective predistortion function corresponding to the lift power level when the determined current power level is at or below the lift power level.

2. The method of claim 1, comprising applying a corrective predistortion function to the signal, the corrective predistortion function corresponding to the determined current power level when the determined current power level exceeds the lift power level.

3. The method of claim 1, comprising determining a corrective predistortion function for each of a plurality of power levels within the range of power levels;

storing each of the determined corrective predistortion functions in a table; and selecting one of the corrective predistortion functions from the table based on the determined current power level.

4. The method of claim 3, comprising selecting the corrective predistortion function from the table that corresponds to the lift power level when the determined current power level is at or below the lift power level; and selecting the corrective predistortion function from the table that corresponds to the determined current power level when the determined current power level is above the lift power level.

5. The method of claim 1, comprising selecting a level that is between about 2 dB and about 6 dB below the maximum power level as the lift power level.

6. The method of claim 1, comprising periodically updating the lift power level.

7. The method of claim 6, comprising determining whether the current power level has been below the lift power level for at least a preselected amount of time; and setting an updated lift power level according to a current power level having a corresponding corrective predistortion function that meets a selected criteria.

8. The method of claim 7, wherein the selected criteria comprises the corresponding corrective predistortion function being updated within a selected time of a time corresponding to the current power level.

9. The method of claim 6, comprising
decreasing the lift power level when the current power level has been below the lift level for at least a selected number of sampling intervals; and
subsequently increasing the lift power level responsive to the current power level increasing.

10. A device for processing a signal, comprising
a component that tends to introduce distortion as a result of processing the signal; and
a predistortion function selector configured to select a corrective predistortion function to be applied to the signal based on a current signal power level, the predistortion function selector selecting a corrective predistortion function corresponding to a lift power level between a maximum signal power level and a minimum signal power level when the current signal power level is at or below the lift power level.

11. The device of claim 10, wherein the predistortion function selector is configured to apply a corrective predistortion function corresponding to the determined current power level when the determined current power level exceeds the lift power level.

12. The device of claim 10, wherein the predistortion function selector is configured to
determine a corrective predistortion function for each of a plurality of power levels within the range of power levels;
store each of the determined corrective predistortion functions in a table; and
select one of the corrective predistortion functions from the table based on the determined current power level.

13. The device of claim 12, wherein the predistortion function selector is configured to
select the corrective predistortion function from the table that corresponds to the lift power level when the determined current power level is at or below the lift power level; and
select the corrective predistortion function from the table that corresponds to the determined current power level when the determined current power level is above the lift power level.

14. The device of claim 10, wherein the predistortion function selector is configured to select a level that is between about 2 dB and about 6 dB below the maximum power level as the lift power level.

15. The device of claim 10, wherein the predistortion function selector is configured to periodically update the lift power level.

16. The device of claim 10, wherein the predistortion function selector is configured to
determine whether the current power level has been below the lift power level for at least a preselected amount of time; and
set an updated lift power level according to a current power level having a corresponding corrective predistortion function that meets a selected criteria.

17. The device of claim 16, wherein the selected criteria comprises the corresponding corrective predistortion function being updated within a selected time of a time corresponding to the current power level.

18. The device of claim 10, wherein the predistortion function selector is configured to
decrease the lift power level when the current power level has been below the lift level for at least a selected number of sampling intervals; and
subsequently increase the lift power level responsive to the current power level increasing.

* * * * *